United States Patent
Cazier

(10) Patent No.: US 7,430,004 B2
(45) Date of Patent: Sep. 30, 2008

(54) VOLUME CONTROL LINKED WITH ZOOM CONTROL

(75) Inventor: Robert P. Cazier, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 796 days.

(21) Appl. No.: 10/705,272

(22) Filed: Nov. 8, 2003

(65) Prior Publication Data

US 2005/0099511 A1    May 12, 2005

(51) Int. Cl.
*H04N 5/76* (2006.01)
*H04N 5/262* (2006.01)

(52) U.S. Cl. .............. 348/231.4; 348/240.99; 381/107; 381/56

(58) Field of Classification Search .............. 348/231.4, 348/240.99, 240.2, 240.1, 462, 460, 231.99; 381/104, 108, 107, 56; 715/727, 978; 396/312; 386/96

See application file for complete search history.

(56) References Cited

U.S. PATENT DOCUMENTS

| | | | |
|---|---|---|---|
| 6,040,831 A * | 3/2000 | Nishida | 715/727 |
| 6,281,925 B1 * | 8/2001 | Kosaka | 348/14.02 |
| 6,573,909 B1 * | 6/2003 | Nagao | 715/727 |
| 6,683,649 B1 * | 1/2004 | Anderson | 348/333.05 |
| 6,919,925 B2 * | 7/2005 | Kudo | 348/231.4 |
| 6,931,138 B2 * | 8/2005 | Kawamura et al. | 381/92 |
| 7,072,477 B1 * | 7/2006 | Kincaid | 381/107 |
| 2003/0151678 A1 * | 8/2003 | Lee et al. | 348/231.4 |

FOREIGN PATENT DOCUMENTS

JP    2000278581 A    * 10/2000

* cited by examiner

*Primary Examiner*—Lin Ye
*Assistant Examiner*—Hung H Lam

(57) ABSTRACT

Digital cameras and methods wherein volume control is linked with zoom control. The present invention captures audio along with recorded images at different zoom settings, and upon playback adjusts the sound output volume (audio apparatus gain) based upon the zoom control setting.

17 Claims, 4 Drawing Sheets

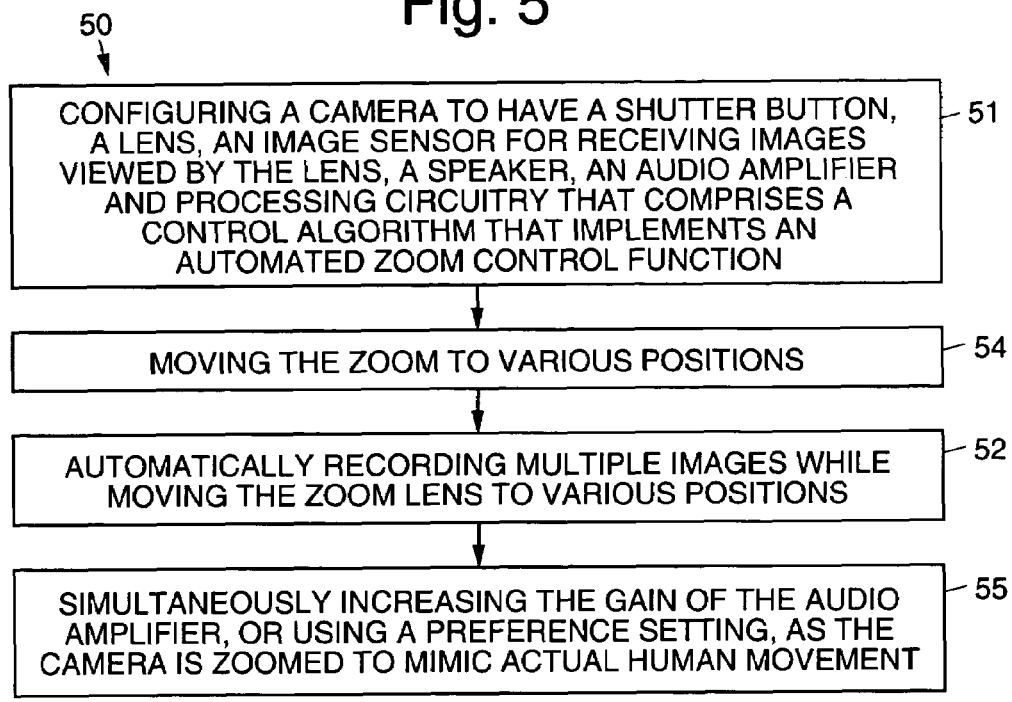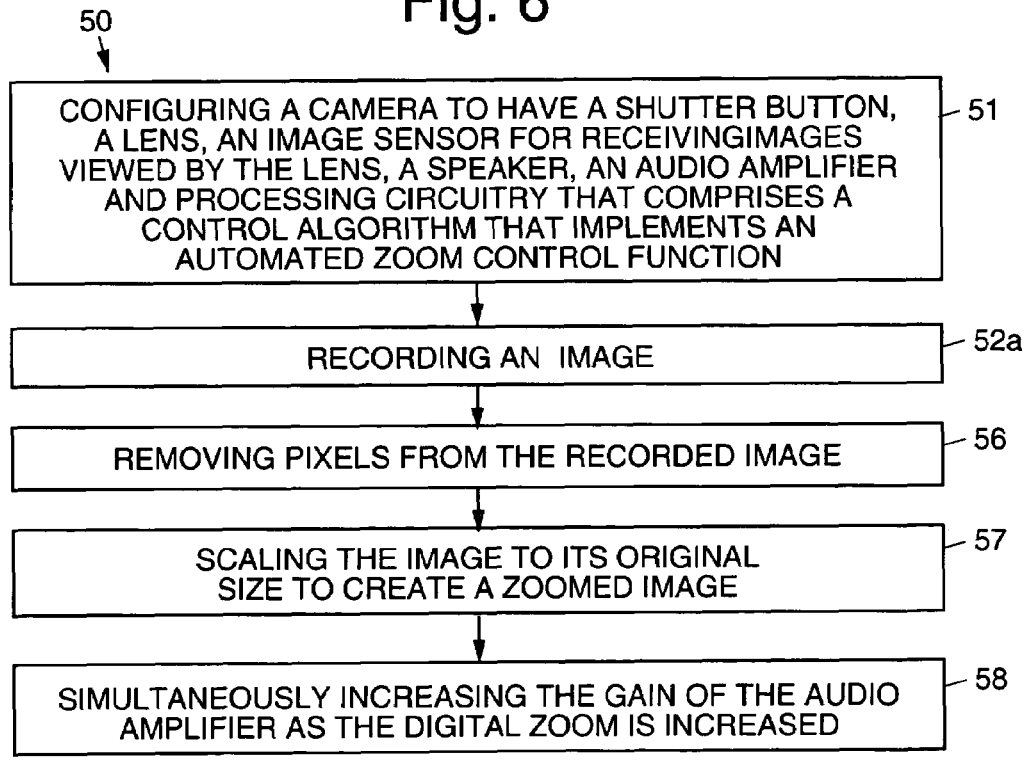

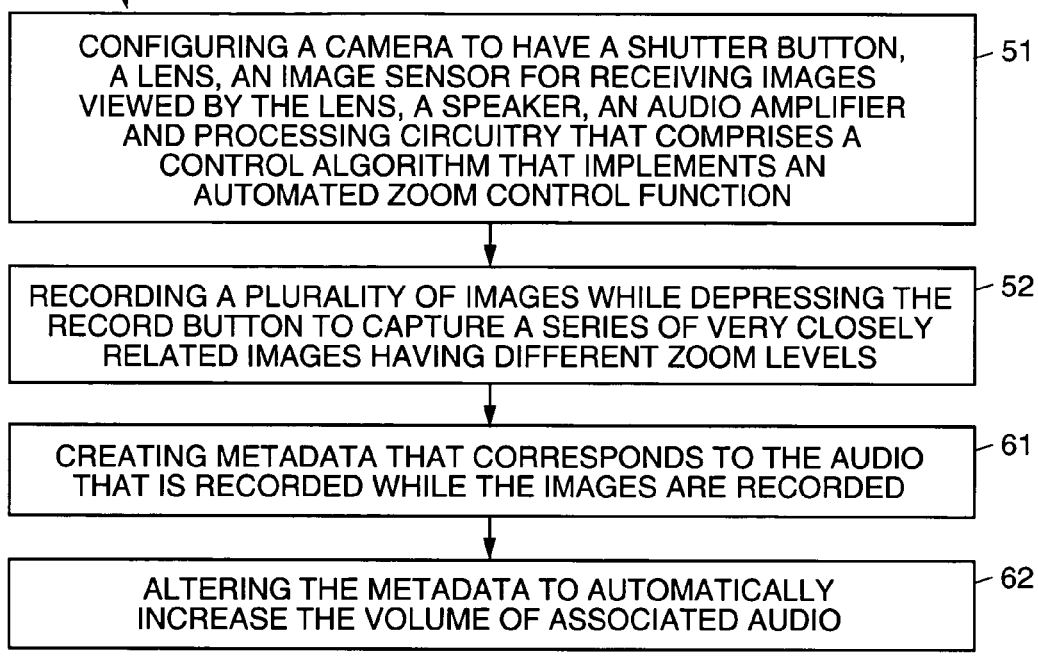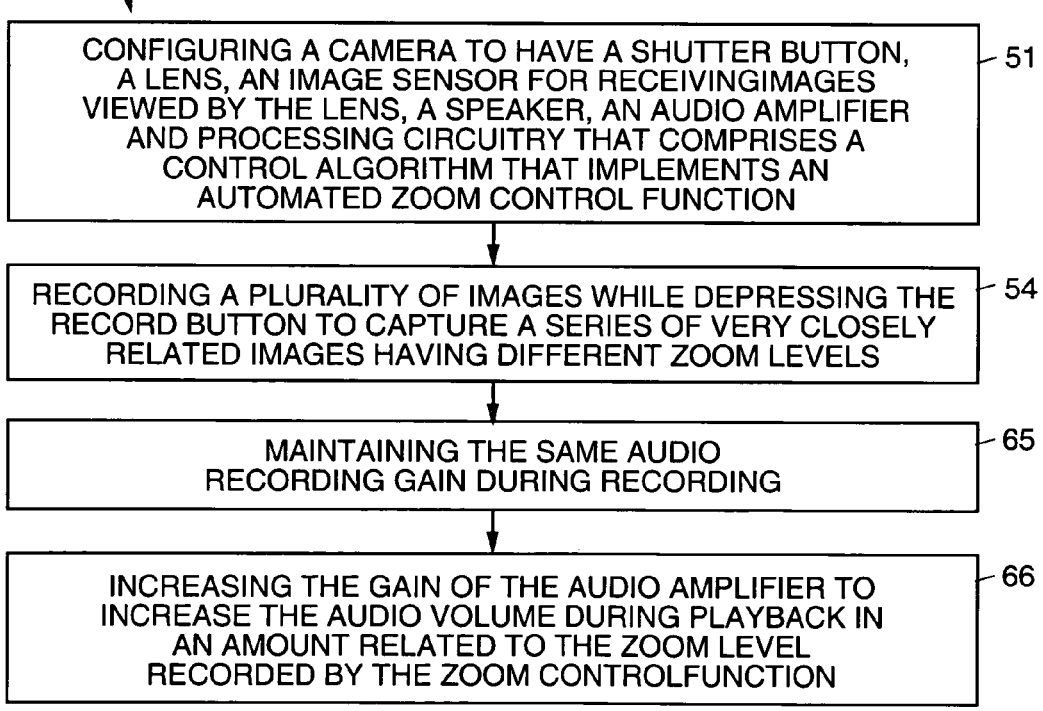

VOLUME CONTROL LINKED WITH ZOOM CONTROL

CROSS REFERENCE TO RELATED APPLICATIONS

This application is related to copending application Ser. No. 10/705,265, filed on the same day as the present application, entitled "Automated Zoom Control", which is assigned to the assignee of the present invention. This copending application is incorporated herein by reference in its entirety.

TECHNICAL FIELD

The present invention relates generally to digital camera systems and methods.

BACKGROUND

In prior solutions, additional knobs or controls are required to implement volume control linked with zoom control. These prior art attempts are not intuitive, and do not link to viewing experience.

SUMMARY OF THE INVENTION

The present invention provides for digital cameras and methods wherein volume control is linked with zoom control. The present invention captures audio along with recorded images at different zoom settings, and upon playback adjusts the sound output volume (audio amplifier gain) based upon the zoom control setting.

An exemplary embodiment of the camera comprises a record button, imaging apparatus for receiving images viewed by the camera, and audio apparatus. The exemplary camera also comprises processing apparatus that implements an automated zoom control function that automatically records images having different zoom levels while depressing the record button, and which, upon playback, adjusts the gain of the audio apparatus to adjust the sound output volume in an amount related to the zoom level recorded by the zoom control function.

BRIEF DESCRIPTION OF THE DRAWINGS

The various features and advantages of embodiments of the present invention may be more readily understood with reference to the following detailed description taken in conjunction with the accompanying drawings, wherein like reference numerals designate like structural elements, and in which:

FIGS. 4-8 are flow diagrams illustrating exemplary methods in accordance with the principles of the present invention, and which are implemented in the digital camera shown in FIGS. 1-3.

DETAILED DESCRIPTION

Figure 1:
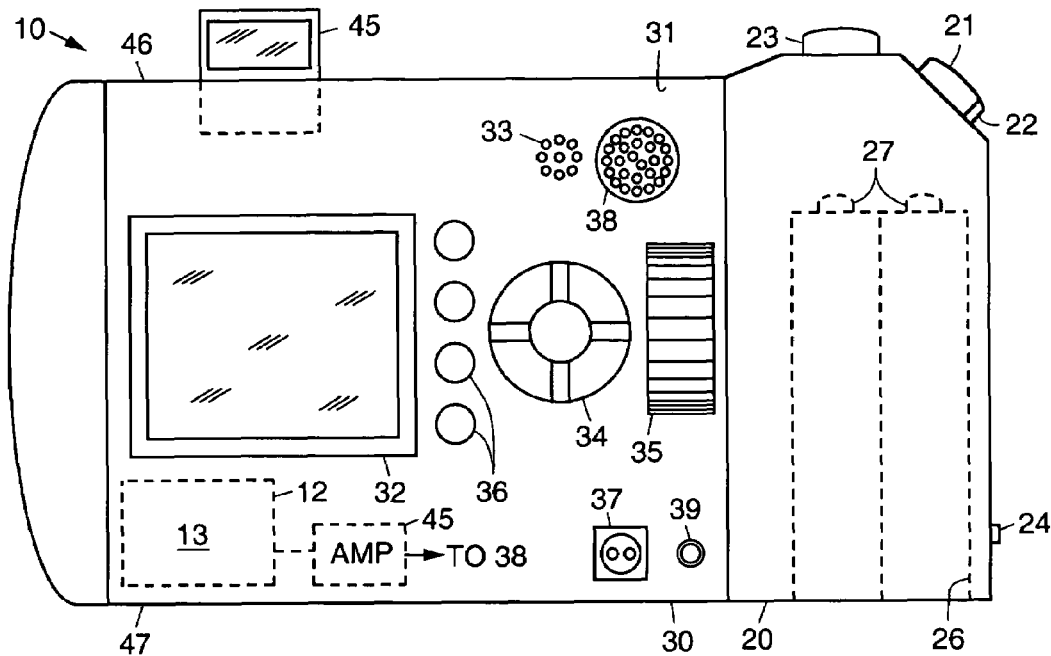
FIG. 1 is a rear view of an exemplary embodiment of a digital camera in accordance with the principles of the present invention having volume control linked with zoom control.
Figure 2:
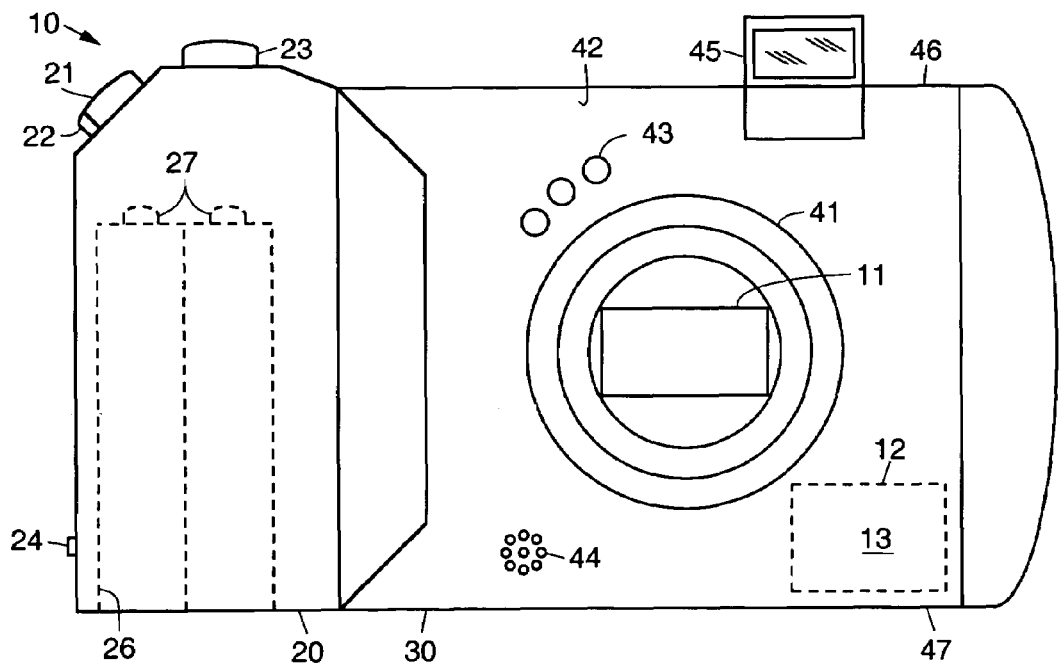
FIG. 2 is a front view of the exemplary digital camera.
Figure 3:
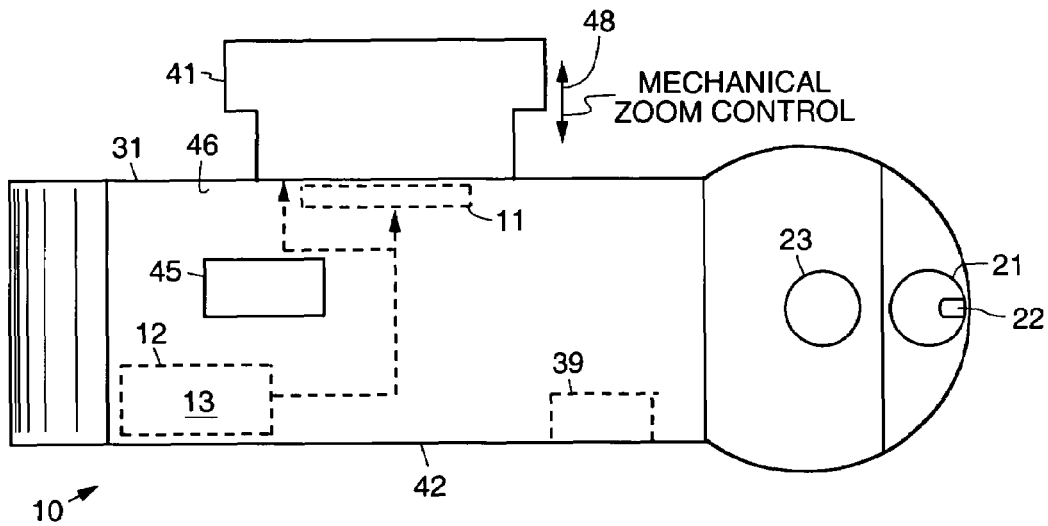
FIG. 3 is a top view of the exemplary digital camera.
Figure 4:
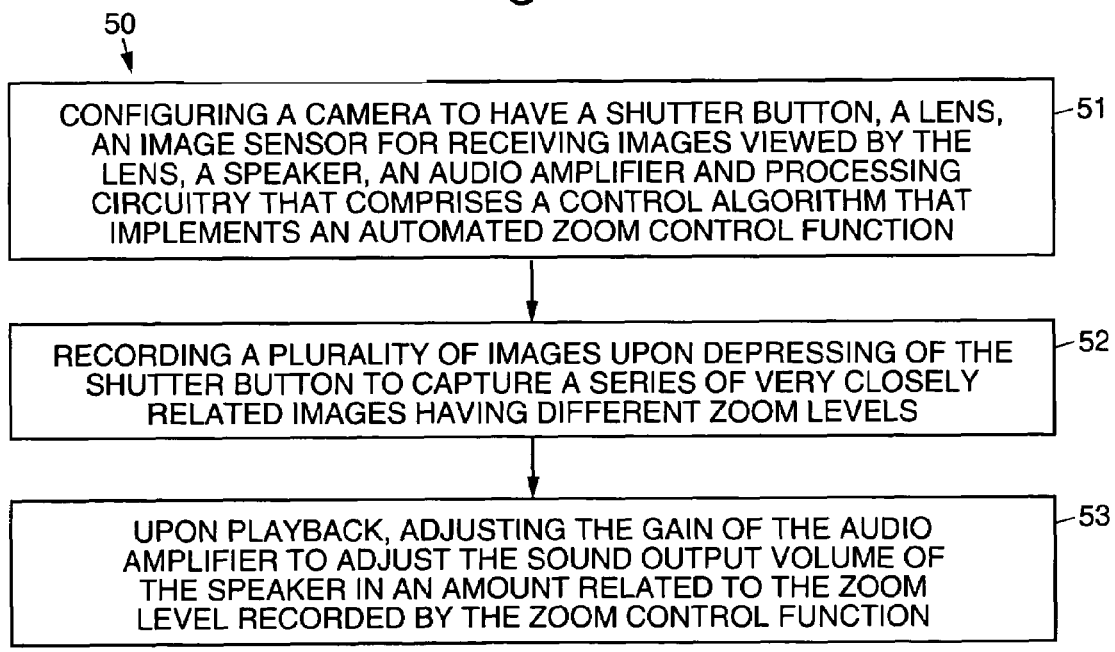

Referring to the drawing figures, FIGS. 1, 2 and 3 show rear, front, and top views, respectively, of an exemplary embodiment of a digital video camera 10 having volume control linked with zoom control 50 in accordance with the principles of the present invention. Exemplary methods 50 are illustrated in FIGS. 4-8 that are implemented in the digital camera 10 shown in FIGS. 1-3.

As is shown in FIGS. 1 and 2, the exemplary digital camera 10 comprises a handgrip section 20 and a body section 30. The handgrip section 20 includes a power button 21 having a lock latch 22, a record button 23, a strap connection 24, and a battery compartment 26 for housing batteries 27.

As is shown in FIG. 1, a rear surface 31 of the body section 30 comprises a display 32, such as a liquid crystal display (LCD) 32 or viewfinder 32, a rear microphone 33, a joystick pad 34, a zoom control dial 35, a plurality of buttons 36 for setting functions of the camera 10 and an output port 37 for downloading images to a computer, for example, a speaker 38, a headphone jack 39 and an audio amplifier 45.

As is shown in FIG. 2, a lens, 41, which may be a zoom lens 41, extends from a front surface 42 of the digital camera 10. A metering element 43 and front microphone 44 are disposed on the front surface 42 of the digital camera 10.

An image sensor 11 is coupled to processing circuitry 12 are housed within the body section 30. The processing circuitry 12 comprises a zoom/volume control algorithm 13 that is used to implement the automated zoom control and volume function of the digital camera 10. This will be discussed in more detail below.

The zoom function may be implemented using a mechanical zoom control 48 (generally designated) that moves certain optical elements of the zoom lens 41 to different physical positions. Alternatively, the zoom function may be implemented using digital zoom control (which may be performed using the processing circuitry 12 and zoom/volume control algorithm 13) wherein pixels of a recorded image are "thrown out" or removed from the recorded image, and the image is scaled to its original size to create the illusion of zoom capture.

The digital camera 10 and methods 50 (FIGS. 4-8) capture audio along with recorded images at different zoom settings, and upon playback adjusts the sound output volume (the gain of the audio amplifier 45) along with the zoom setting. In all of the present methods 50, and with reference to the method 50 illustrated in FIG. 4, the camera 10 is configured 51 to have a record button 23, a lens 41, an image sensor 11 for receiving images viewed by the lens 41, a speaker 38, an audio amplifier 45, and processing circuitry 12 that comprises a control algorithm 13 that implements an automated zoom control function.

In general, the method 50 and the camera 10 (using the control algorithm 13), when using mechanical zoom, automatically records 52 a plurality of closely related images having different zoom levels while depressing the record button 23. Upon playback, the camera 10 (using the control algorithm 13) adjusts 53 the gain of the audio amplifier 45 to adjust the sound output volume of the speaker 39 in an amount related to the zoom level recorded by the zoom control function.

Similarly, the method 50 and the camera 10 (using the control algorithm 13), when using digital zoom, automatically records 52 an image while depressing the record button 23. The recorded image is digitally zoomed during postview. During postview zooming, the camera 10 (using the control algorithm 13) adjusts 53 the gain of the audio amplifier 45 to adjust the sound-output volume of the speaker 39 in an amount related to the zoom level.

In one embodiment of the digital camera 10 and method 50, and with reference to the method 50 illustrated in FIG. 5, the zoom function is implemented using a mechanical zoom control that moves certain optical elements of the zoom lens 41 to different physical positions. The camera 10 automatically captures 52 or records 52 multiple images while moving 54 the lens 41 (zooming 54) to various positions. As this is done, the gain of the audio amplifier 45 is simultaneously incremented upward 55 (increased 55) in a satisfactory manner as the camera 10 is zoomed toward the subject (and vice-versa) to mimic actual human movement, or is done with a preference setting, for example. Thus, the volume is adjusted as a function of the zoom setting. Manually zooming the camera 10 also increases the volume by increasing the gain of the output of the microphone(s) 33, 44 of the camera 10.

In another embodiment of the digital camera 10 and method 50, and with reference to the method 50 illustrated in FIG. 6, the zoom function is implemented using digital zoom control, which may be performed using processing circuitry 12 and the control algorithm 13. In this embodiment, an image is captured 52 or recorded 52 by the camera 10. Pixels of the recorded image are removed 56 (cropped 56) from the recorded image, and the image is scaled 57 to its original size to create a zoomed image, thus creating the illusion of zoom capture. As digital zoom is increased, the gain of the audio amplifier 45 is increased 58 to increase the audio output volume.

In another embodiment of the digital camera 10 and method 50, and with reference to the method 50 illustrated in FIG. 7, images are captured 52 or recorded 52 by the camera 10. When viewing the recorded images (i.e., postview), metadata is created 61 (that corresponds to the audio that was recorded) and the metadata is altered 62 to automatically increase the volume of associated audio (which may also be betadata or a pointer to a file name) as the apparent zoom is increased (or the image is cropped). This simply requires a metadata line item explaining the size of the original picture. Software that implements the zoom control algorithm 13 automatically determines the scale of the gain of the audio amplifier 45 using the "original" picture size as a reference.

In another embodiment of the digital camera 10 and method 50, and with reference to the method 50 illustrated in FIG. 8, an image is captured 52 or recorded 52 by the camera 10 The recording gain (gain of the microphones 33, 44) is left the same 64 during recording. The gain of the audio amplifier 45, and hence the audio output volume of the speaker 38 is turned up 65, or increased 65 during playback in an amount related to the zoom level recorded by the zoom control function.

In addition, the zoom function (and gain control) may be used to automatically adjust 66 the gain of headphones (not shown) attached to the headphone jack 39 of the camera 10 so that a photographer can hear the affect on the volume. This may be done with any of the embodiments of the camera 10, or methods 50.

The present invention increases the authenticity of the post-viewing experience. The viewer has a greater feel regarding "being there" with respect to the viewed images. In the case of a single picture or image, the output gain on the speaker may be increased as the viewer pushes on the zoom button (in some instances increasing magnify/post-view zoom as well), providing louder audio output (speaker or headphones).

In the case of multiple images of the same subject, the audio gain is automatically tied to the zoom factor such that playing back images increases the volume as the zoom increases. If the gain is the left the same during image capture, the volume output of the speaker is turned up on playback. This provides a way not to capture near voices in a negatively-impacting way. If the gain is turned up as the zoom is increased, the playback uses the audio file as captured.

The present invention allows the post-viewing experience to be similar to the capture experience. Human factors are also a consideration in that intuitively zooming in or walking towards a sound increases the volume. The present invention automates capture and playback in such a way as to mimic the experience of capturing an image to the user. The present invention also eliminates the need for another control (volume) on the camera.

Thus, digital cameras and methods that provide volume control linked with zoom control have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A camera comprising:
a record button;
an audio microphone;
a lens;
an image sensor for receiving images viewed by the lens;
a speaker;
an audio amplifier; and
processing circuitry that comprises a control algorithm that implements an automated zoom control function that automatically records images having different zoom levels while depressing the record button, and which, upon playback and postview zooming, adjusts the gain of the audio amplifier to adjust the sound output volume in an amount related to the zoom level recorded by the zoom control function;
wherein the processing circuitry simultaneously changes the gain of the audio amplifier, but not an audio recording gain of the audio microphone, while the images are being recorded of a subject to mimic actual human movement to and from the subject as the zoom level changes and wherein the processing circuitry creates betadata having a pointer to a file name of the recorded image, and during postview, alters the betadata to automatically increase the volume of associated audio as the amplifier using an original picture size as a reference;
wherein the processing circuitry keeps the audio recording gain of the audio microphone at a same audio recording level while the zoom levels change during recording of the images.

2. The camera recited in claim 1 which comprises digital zoom control wherein pixels of a recorded image are removed from the recorded image and the resultant image is scaled to its original size to create the illusion of zoom capture, and wherein the control algorithm adjusts the gain of the audio amplifier as a function of the digital zoom.

3. The camera recited in claim 1 wherein the control algorithm, when viewing the recorded images, creates metadata corresponding to recorded audio and alters the metadata to automatically increase the volume of audio as the apparent zoom is increased.

4. The camera recited In claim 1 which has headphones coupled thereto, and wherein the control algorithm automatically adjust headphone gain.

5. A camera comprising:
a record button;
an audio microphone;
a lens;
a mechanical zoom control that moves certain optical elements of the lens to different physical positions;
an image sensor for receiving images viewed by the lens;

a speaker;
an audio amplifier; and
processing circuitry that comprises a control algorithm that implements an automated zoom control function that zooms the lens while recording images and simultaneously adjusts the gain of the audio amplifier as a function of zoom position, and which, upon playback and postview zooming, adjusts the gain of the audio amplifier to adjust the sound output volume in an amount related to the zoom level recorded by the zoom control function;
wherein the processing circuitry simultaneously changes the gain of the audio amplifier, but not an audio recording gain of the audio microphone, while the images are being recorded of a subject to mimic actual human movement to and from the subject as the zoom level changes and wherein the processing circuitry creates betadata having a pointer to a file name of the recorded image, and during postview, alters the betadata to automatically increase the volume of associated audio as the image is cropped by automatically determining a scale of the gain of the audio amplifier using an original picture size as a reference;
wherein the processing circuitry keeps the audio recording gain of the audio microphone at a same audio recording level while the zoom levels change during recording of the images.

6. The camera recited in claim 5 wherein the control algorithm, when viewing the recorded images, creates metadata corresponding to recorded audio and alters the metadata to automatically increase the volume of audio as the apparent zoom is increased.

7. The camera recited in claim 5 which has headphones coupled thereto, and wherein the control algorithm automatically adjust headphone gain.

8. A method comprising the steps of:
configuring a camera to have a record button, a lens, an audio microphone, an image sensor for receiving images viewed by the lens, and processing circuitry that comprises a control algorithm;
automatically recording a plurality of images while depressing the record button to capture a series of very closely related images having different zoom levels;
during playback and postview zooming, adjusting the gain of the audio amplifier to adjust the sound output volume in an amount related to the zoom level recorded by tile zoom control function; and
simultaneously changing the gain of the audio amplifier, but not an audio recording gain of the audio microphone, while the images are being recorded of a subject to mimic actual human movement to and from the subject as the zoom level changes, creating betadata having a pointer to a file name of the recorded image and during postview, and altering the betadata to automatically increase the volume of associated audio as the image is cropped by automatically determining a scale of the gain of the audio amplifier using an original picture size as a reference; and
keeping the audio recording gain of the audio microphone at a same audio recording level while the zoom levels change during recording of the images.

9. The method recited in claim 8 wherein the step of automatically recording the images comprises removing pixels of a recorded image from the recorded image and scaling the resultant image to its original size to create the illusion of zoom capture.

10. The method recited in claim 8 wherein the step of automatically recording the images comprises automatically recording a plurality of images to capture a series of very closely related images having different zoom levels.

11. The method recited in claim 8 wherein the step of adjusting the gain comprises creating metadata corresponding to recorded audio and altering the metadata to automatically adjust the volume of audio as the apparent zoom is adjusted.

12. A method comprising the steps of:
configuring a camera to have a record button, a lens, an audio microphone, an image sensor for receiving images viewed by the lens, and processing circuitry that comprises a control algorithm;
automatically recording a plurality of images while depressing the record button to capture a series of very closely related images having different zoom levels by moving certain optical elements of the lens to different physical positions;
upon playback and postview zooming, adjusting the gain of the audio amplifier to adjust the sound output volume in an amount related to the zoom level recorded by the zoom control function; and
simultaneously changing the gain of the audio amplifier, but not an audio recording pain of the audio microphone, while the images are being recorded of a subject to mimic actual human movement to and from the subject as the zoom level changes, creating betadata having a pointer to a file name of the recorded image and during postview, and altering the betadata to automatically increase the volume of associated audio as the image is cropped by automatically determining a scale of the gain of the audio amplifier using an original picture size as a reference; and
keeping the audio recording gain of the audio microphone at a same audio recording level while the zoom levels change during recording of the images.

13. The method recited in claim 12 wherein the step of adjusting the gain comprises creating metadata corresponding to recorded audio and altering the metadata to automatically adjust the volume of audio as the apparent zoom is adjusted.

14. The method recited in claim 12 wherein the step of adjusting the gain comprises the steps of:
keeping the gain the same during recording; and
adjusting the gain of the audio amplifier, and hence the audio output volume of the speaker, during playback in an amount related to the zoom level.

15. A camera comprising:
a record button;
an audio microphone;
image means for receiving images viewed by the camera;
audio apparatus; and
processing means that implements an automated zoom control function for automatically recording images having different zoom levels while depressing the record button, and which, upon playback and postview zooming, adjusts audio apparatus gain to adjust the sound output volume in an amount related to the zoom level recorded by the zoom control function;
wherein the processing circuitry simultaneously changes the gain of the audio amplifier, but not an audio recording gain of the audio microphone, while the images are being recorded of a subject to mimic actual human movement to and from the subject as the zoom level changes and wherein the processing circuitry creates betadata having a pointer to a file name of the recorded image, and during postview, alters the betadata to automatically increase the volume of associated audio as the image is cropped by automatically determining a scale of the gain of the audio amplifier using an original picture size as a reference;

wherein the processing circuitry keeps the audio recording gain of the audio microphone at a same audio recording level while the zoom levels change during recording of the images.

16. The camera recited in claim 15 wherein the processing means comprises a mechanical zoom control that moves certain optical elements of the lens to different physical positions, and which zooms the image means while recording the images and simultaneously adjusts the gain of the audio apparatus as a function of zoom position.

17. The camera recited in claim 15 wherein the processing means comprises digital zoom control wherein pixels of a recorded image are removed from the recorded image and the resultant image is scaled to its original size to create the illusion of zoom capture, and which adjusts the gain of the audio apparatus as a function of the digital zoom.

* * * * *

UNITED STATES PATENT AND TRADEMARK OFFICE
CERTIFICATE OF CORRECTION

PATENT NO. : 7,430,004 B2 Page 1 of 1
APPLICATION NO. : 10/705272
DATED : September 30, 2008
INVENTOR(S) : Robert P. Cazier It is certified that error appears in the above-identified patent and that said Letters Patent is hereby corrected as shown below:

In column 4, line 41, in Claim 1, after "as the" insert -- image is cropped by automatically determining a scale of the gain of the audio --.

In column 4, line 58, in Claim 4, delete "In" and insert -- in --, therefor.

In column 5, line 47, in Claim 8, delete "tile" and insert -- the --, therefor.

In column 6, line 25, in Claim 12, delete "pain" and insert -- gain --, therefor.

Signed and Sealed this

Twenty-third Day of December, 2008

JON W. DUDAS
*Director of the United States Patent and Trademark Office*